(12) United States Patent
Bruel

(10) Patent No.: US 6,261,928 B1
(45) Date of Patent: Jul. 17, 2001

(54) PRODUCING MICROSTRUCTURES OR NANOSTRUCTURES ON A SUPPORT

(75) Inventor: Michel Bruel, Veurey (FR)

(73) Assignee: Commissariat a l 'Energie Atomique, Paris (FR)

( * ) Notice: Subject to any disclaimer, the term of this patent is extended or adjusted under 35 U.S.C. 154(b) by 0 days.

(21) Appl. No.: 09/463,226

(22) PCT Filed: Jul. 20, 1998

(86) PCT No.: PCT/FR98/01585

§ 371 Date: Feb. 22, 2000

§ 102(e) Date: Feb. 22, 2000

(87) PCT Pub. No.: WO99/05711

PCT Pub. Date: Feb. 4, 1999

(30) Foreign Application Priority Data

Jul. 22, 1997 (FR) .................................................. 97 09264

(51) Int. Cl.$^7$ .................................................... H01L 21/46
(52) U.S. Cl. ......................... 438/459; 438/455; 148/33; 156/153
(58) Field of Search .................................... 438/406, 455, 438/458, 459, 478; 148/33, DIG. 3; 156/153

(56) References Cited

U.S. PATENT DOCUMENTS

| | | | |
|---|---|---|---|
| 5,453,394 | * 9/1995 | Yonehara et al. | 438/458 |
| 5,466,303 | * 11/1995 | Yamaguchi et al. | 148/33 |
| 5,494,835 | 2/1996 | Bruel . | |
| 5,559,043 | 9/1996 | Bruel . | |
| 5,755,914 | * 5/1998 | Yonehara | 156/281 |
| 5,798,294 | * 8/1998 | Okonogi | 438/459 |
| 5,804,086 | 9/1998 | Bruel . | |
| 5,863,830 | * 1/1999 | Bruel et al. | 438/478 |
| 5,877,070 | * 3/1999 | Goesele et al. | 438/458 |
| 5,882,987 | * 3/1999 | Srikrishnan | 438/458 |
| 5,897,362 | * 4/1999 | Wallace | 438/455 |
| 5,932,048 | * 8/1999 | Furukawa et al. | 156/153 |
| 5,981,400 | * 11/1999 | Lo | 438/745 |
| 5,985,688 | 11/1999 | Bruel . | |
| 6,013,563 | * 1/2000 | Henley et al. | 438/458 |

OTHER PUBLICATIONS

S.H. Zaidi, et al., Materials Research Society Symp. Proc., vol. 358, pps. 957–968, "Scalable Fabrication and Optical Characterization of nm Structures," 1995.

T. Komoda, et al., Materials Research Society Symp. Proc, vol. 358, pps. 163–168, "Control of and Mechanisms for Room Temperature Visible Light Emission from Silicon Nanstructures in $SiO_2$ Formed By $SI^+$Ion Implantation," 1995.

P. Ll, et al., Materials Research Society Symp, Proc., vol. 358, pps. 123–126, "Generation and Structural Analysis of Silicon Nanoparticles," 1995.

(List continued on next page.)

Primary Examiner—Charles Bowers
Assistant Examiner—David S Blum
(74) Attorney, Agent, or Firm—Oblon, Spivak, McClelland, Maier & Neustadt, P.C.

(57) ABSTRACT

A method for producing a micro- or nanostructure on a substrate. In a first step, one surface of a first wafer in crystalline material is placed in contact with one surface of a second wafer in crystalline material, such that crystalline lattices presented by the surfaces offer at least one mismatch parameter able to allow the formation of a lattice of crystalline defects and/or of a lattice of strains within a crystalline zone extending on either side of the interface of the two wafers, at least one of the lattices determining the micro- or nanostructure. Then, one of the two wafers is thinned to expose the lattice defects and/or the lattice strains on a substrate formed by the other wafer.

25 Claims, 3 Drawing Sheets

OTHER PUBLICATIONS

D.W. Boeringer, et al., Materials Research Society Symp. Proc, vol. 358, pps. 569–574, "Modelling The Multiplicity of Conductance Structures in Clusters of Silicon Quantum Dots," 1995.

G.S. Higashi, et al., Handbook of Semiconductor Wafer Cleaning Technology, p..433, "Silicon Surface Chemical Composition and Morphology".

H. Foell, et al., Philosophical Magazine A, vol. 40, No. 5, pps. 589–610, "TEM Observations on Grain Boundaries in Siintered Silicon," 1979.

Yang et al Gold Gettering in Directly Bonded Silicon Wafers May 1989 Japanese Journal of Applied Physics pp. 721–724.*

Benamara et al Structural and Electrical Investigations of Silicon Wafer Bonding Interfaces Mar. 1996 Materials science and Engineering pp. 164–167.*

Abe et al Dislocation–Free Silicon OC Sapphire by Wafer Bonding 1994 Japanese Journal of Applied Physics vol 33 pp. 514–518.*

* cited by examiner

PRODUCING MICROSTRUCTURES OR NANOSTRUCTURES ON A SUPPORT

TECHNICAL FIELD

The present invention relates to the production of a microstructure or a nanostructure on a substrate.

BACKGROUND OF THE INVENTION

1. Field of the Invention

2. Discussion of the Background

Ever smaller sizes, are in the form of a lattice of microvolumes of material obtained on the surface of a substrate. By microvolume is meant for example volumes of parallelepiped shape preferably less than one micrometer in size.

Generally, interest is focused on microstructures in semiconductor material, in particular in silicon, in AsGa, in III–V compounds and SiC. However there is also interest in conductor materials, such as metals, and in dielectric materials such as SiO2.

These micro- or nanostructures are intended for the production of electronic, optic or optoelectronic devices. In particular, with these types of structures it is possible to produce a network of quantum dots, or electronic devices called mono-electrons, or Coulomb blockade electronic devices, or even light-emitting devices.

If it is desired to produce microstructures, techniques are used that are nowadays conventional in the area of microelectronics. In particular, the principles of lithography combined with dry or wet etching operations are used, or ion implantation, depositing, or heat treatment. For example, if it is desired to produce a square network of parallelepiped microvolumes in monocrystalline silicon, with each microvolume having a side length of 1 $\mu$m and a thickness of 0.2 $\mu$m, the microvolumes being separated by a distance of 0.5 $\mu$m, it is possible to use a SOI wafer (Silicon-on-Insulator) having a monocrystalline silicon layer 0.2 $\mu$m thick. To the wafer silicon layer is applied a photosensitive resin layer which is insulated by means of an Electron Beam Pattern Generator such as to pattern the resin with a matrix of lines and columns 0.5 $\mu$m wide representing the spaces in between the microvolumes. Resin development, to develop the exposed parts, uncovers the silicon layer corresponding to the matrix of lines and columns. The wafer is then subjected to plasma etching for selective removal of the silicon in relation to the resin. The etching operation is completed when the underlying silicon layer is reached. After removing the resin, a network of microvolumes is obtained each 1 $\mu$m×1 $\mu$m×0.2 $\mu$m in size and spaced at 0.5 $\mu$m intervals. If necessary, the spaces between the microvolumes may then be filled in with a dielectric layer such as SiO$_2$, either using a heat oxidation process or a depositing process of CVD type.

A network of microvolumes may also be produced by lithography using an interferometry or holography technique, such as disclosed by the article: "Scalable Fabrication and Optical Characterization of nm Si Structures" by S. H. ZAIDI et al., published in Mat. Res. Soc. Symp. Proc. Vol. 358, pages 957–968, Materials Research Society.

With the use of these techniques it is possible to produce microstructures for sizes of the order of one micrometer or a few tenths of a micrometer. To obtain the best resolution in terms of lithography, electron beam pattern generation is used or a photo repeater operating at a wavelength of 248 nm or 193 nm.

To produce microstructures with much smaller-sized microvolumes (for example a few tenths of a nanometer), no known means are available if it is desired, in economically acceptable manner and on large surfaces, to obtain microstructures arranged in a pre-determined plan of arrangement.

It is to be noted however that it is possible to produce microvolumes in a first material inside a matrix of a second material, for example by using ion implantation to insert atoms of the first material in this matrix, their concentration being such and applied heat treatment being such that these atoms collect as precipitates inside the matrix. In this way it is possible to obtain precipitates of silicon in a SiO$_2$ matrix of the order of 10 nm. Said technique is described for example in the article "Control of and Mechanisms for Room Temperature Visible Light Emission from Silicon Nanostructures in SiO$_2$, formed by Si$^+$ Ion Implantation" by T. KOMODA et al., published in Mat. Res. Soc. Symp. Proc. Vol. 358, pages 163–168, 1995, Materials Research Society. However, the precipitates obtained are distributed randomly in the matrix.

In similar fashion, by making a deposit (for example by evaporation) on a surface, it is possible to obtain cores of condensation randomly distributed on the surface. The article "Generation and Structural Analysis of Silicon Nanoparticles" by PING LI and K. SATTLER, published in Mat. Res. Soc. Symp. Proc. Vol. 358, pages 123–126, 1995, Materials Research Society, discloses the evaporation of silicon on a silicon or graphite surface.

The applications of these microstructures are multiple and depend upon the particular properties of each one. These properties relate to a size effect on the electronic status of the carriers in these materials, to surface and interface effects, to the existence or not of intergranular phases, etc. One particular application is the production of light emitters, especially from materials such as silicon which, in the solid monocrystalline state, are not light-emitting (see the article by T. KOMOKA cited above). A further application is the production of electronic devices based on the quantum confinement of electronic conductors in the microvolumes of the structure or on Coulomb blockade effects. This application is described in the article "Modelling the Multiplicity of Conductance Structures in Clusters of Silicon Quantum Dots" by D. W. BOERINGER and R. TSU, published in Mat. Res. Soc. Symp. Proc. Vol. 358, pages 569–574, 1995, Materials Research Society.

SUMMARY OF THE INVENTION

The present invention was designed to enable the production of microstructures able to contain microvolumes of much smaller size than the microvolumes which can currently be produced, for example a few tenths of a nm, in economic manner and on large surfaces. In addition, these microstructures are arranged according to a predetermined plan instead of being distributed at random.

The invention puts forward a method for producing micro or nanostructures, which can be applied to crystalline materials whether semiconductor, conductor or dielectric.

The subject matter of the invention is therefore a method for producing a micro or nanostructure on a substrate, characterized in that it entails the following steps:

bonding by placing one surface of a first wafer in crystalline material in contact with one surface of a second wafer in crystalline material, such that the crystalline lattices presented by the said surfaces offer at least one mismatch parameter able to allow the formation of a lattice of crystalline defects and/or a lattice of strains within a crystalline zone extending either side of the interface of the two wafers, at least one of said lattices determining the micro or nanostructure, thinning one of the two wafers to expose the lattice defects and/or the lattice strains on a substrate formed by the other wafer.

The mismatch parameter may be formed by a determined angle of rotational shift in the crystalline lattices presented by said surfaces. The lattice of defects obtained, so-called "twist" lattice, is a lattice of screw dislocations.

The mismatch parameter may also be formed by a difference in crystalline mesh parameter between the crystalline materials of the surfaces of the contacted wafers. The lattice deformation obtained is called a "misfit".

The mismatch parameter may also be formed by a determined angle under which the surface of at least one of the wafers is shifted in relation to the ordinary crystallographic plane of direction corresponding to this surface. The disoriented crystalline surfaces (one only or both) in relation to an ordinary crystallographic plane are called vicinal. The lattice deformation is then called a "miscut".

All combinations of mismatch parameters are possible, for example by bonding two different materials with shifted rotation. Several lattices are then formed.

Contacting may preferably be of hydrophobic type, that is to say by direct bonding of the surfaces of the said wafers. It may be of hydrophilic type, that is to say involving a thin intermediate layer, for example an oxide layer naturally formed on one surface of one wafer or on the surfaces of the wafers.

Advantageously, the method also includes at least one heat treatment step intended either to complete the formation of the lattice defects and/or lattice strains if the contacting is insufficient for its completion, or to end it completely. Also, this treatment may help to strengthen the interatom bonds between the surfaces of the contacted wafers. This heat treatment may be conducted before or after the thinning step.

The thinning step may be conducted using a technique chosen from grinding, mechanical polishing or chemical polishing.

The thinning step may also be conducted by cleaving one of the wafers which, before the contacting step, is subjected via its contacting surface to an ion implantation step intended, at a determined depth corresponding to the desired thinning, to create a layer of microcavities able to generate a cleavage plane during a subsequent heat treatment step. Ion implantation may be conducted using hydrogen ions. If the thinning step is conducted in this way, at least one heat treatment step may be planned making it possible to simultaneously complete or end the formation of the lattice defects and/or lattice strains, to strengthen the intertatom bonds between the surfaces of the contacted wafers and to generate the cleavage plane.

Depending upon the uses for which the micro or nanostructure is intended, after the thinning step a step may be planned consisting of selectively treating the lattice defects and/or lattice strains in relation to said crystalline zone. This will lead in particular to accentuating the difference in physical/electrical or optoelectronic behaviour of the crystalline defects in relation to said crystalline zone or, more generally, to delimit the micro or nanovolumes in or above the crystalline zone. This selective treatment step may consist of making the crystalline defects and/or lattice strains conductive such that said crystalline zone forms crystalline contact pads electrically connected to one another. In this case, phosphorus diffusion may be made which preferably diffuses at the crystalline defects. The selective treatment step may also consist of electric insulation so that said crystalline zone forms crystalline pads that are electrically insulated from one another. In this case, chemical polishing may be used to attack the crystalline lattice defects and/or lattice strains possibly followed by the depositing of an electric insulator. Chemical polishing may be preceded by a decoration phase of the crystalline defects and/or lattice strains by precipitating metallic or doping impurities.

The lattice defects produced by the above-mentioned techniques extend thinly either side of the bonding surface of the two wafers. On the other hand, the strains induced by these defects extend either side of the interface, inside the wafers, over distances of the order of the dislocation period. Therefore, the thinning of one of the wafers may be made by halting the operation at a distance from the interface which is of the same order. On the surface exposed in this way, and before reaching the crystalline defects, the field of surface strains is not uniform and reflects the underlying lattice of defects. The selective treatment step may then consist of depositing, by epitaxy for example, a crystalline material having a crystalline mesh mismatch with the crystalline material exposed by the thinning step, this deposited crystalline material forming an arranged set of islands corresponding to the underlying lattice of crystalline defects.

The electric insulation of the selective treatment may of the type in which electric conduction can take place by a physical effect such as the tunnelling effect or the Fowler-Nordheim effect.

The selective treatment step may also consist of treating the crystalline defects and/lattice strains such that said crystalline zone forms crystalline pads connected together by semiconductor zones or having a potential barrier.

A further object of the invention is a micro or nanostructure on a a substrate, characterized in that it is obtained according to the above-described method using wafers whose contacting surfaces are in semiconductor material. At least one of the surfaces to be placed in contact may be in SiC or in a III–V semiconductor material such as AsGA or GaAlAs.

Yet a further object of the invention is a micro or nanostructure on a substrate, characterized in that it is obtained using the above-described method, one of the wafers being formed of a Silicon-on-Insulator wafer, the other wafer being in silicon and forming the thinned wafer, the method enabling a micro or nanostructure to be obtained made up of microvolumes of silicon on an insulator layer.

BRIEF DESCRIPTION OF THE DRAWINGS

The invention will be better understood and other advantages and particularities will become apparent on reading the following description given as a non-restrictive example together with its appended drawings in which.

DESCRIPTION OF THE PREFERRED EMBODIMENTS

Figure 1A:
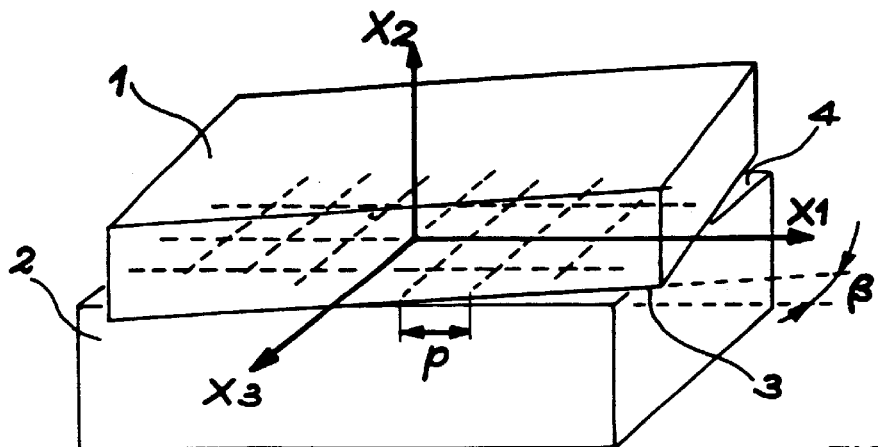
FIG. 1A shows the contacting step of two wafers in crystalline material, according to one variant of the production method of the present invention.
Figure 1B:
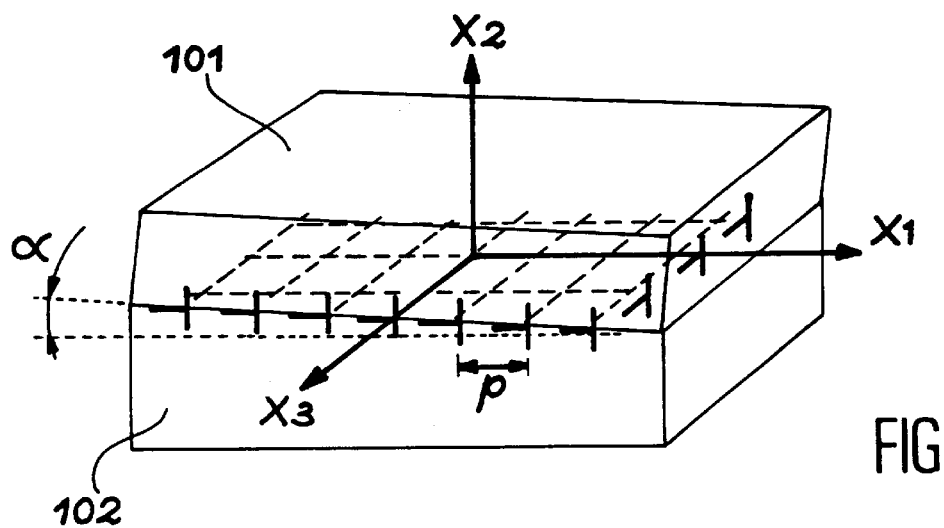
FIG. 1B shows the contacting step of two wafers in crystalline material, according to a second variant of the production method of the present invention.
Figure 1C:
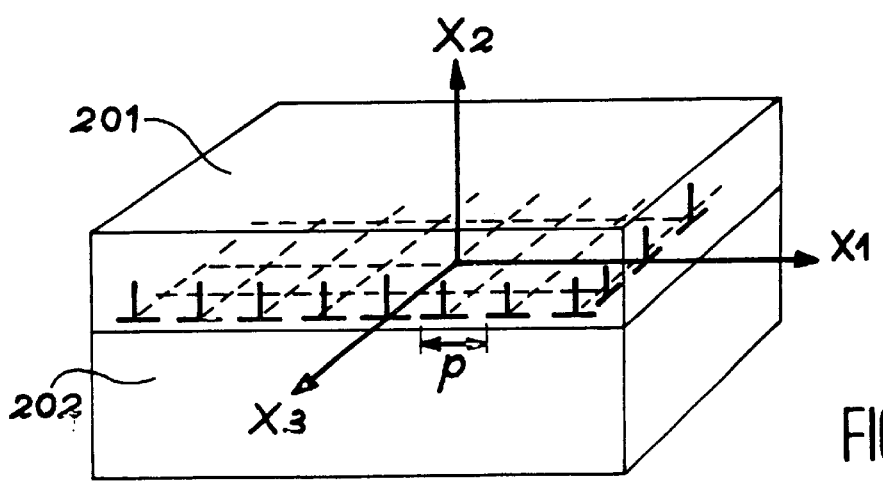
FIG. 1C shows the contacting step of two wafers in crystalline material, according to a third variant of the production method of the present invention.

FIGS. 1A, 1B and 1C illustrate three variants of embodiment of the method of the present invention. $X_1$, $X_2$ and $X_3$ represent the crystallographic axes. In the case shown in FIG. 1A, the parameter which regulates defect density (or the average distance between defects) is the angle of rotation β existing between the crystalline networks presented by the contacted surfaces of wafers 1 and 2. In the case shown in FIG. 1B, the parameter which regulates defect density (or the average distance between defects) is the angle of rotation α existing between the crystallographic planes of wafers 101 and 102 placed in contact. In the case shown in FIG. 1C, the parameter which regulates defect density (or the average distance between defects) is the mesh mismatch f1 between the two crystalline materials of wafers 201 and 202 placed in contact.

The table below gives the values of the angle of rotation β, of the angle of disorientation α and of the mesh mismatch f1, in relation to the period p of the lattice of defects on the interface (for silicon 100).

| Period (nm) | 76   | 38.4 | 19.2 | 9.6  | 3.8 |
|-------------|------|------|------|------|-----|
| α (°)       | 0.2  | 0.4  | 0.8  | 1.6  | 4   |
| β (°)       | 0.29 | 0.6  | 1.2  | 2.4  | 6   |
| $f_1$ (%)   | 0.5  | 1    | 2    | 4    | 10  |

By way of example, for the variant of the method illustrated in FIG. 1A, two wafers in silicon (100) bonded with a rotation β of 1.2° form on their interface a square lattice of screw dislocations having a period of 19.2 nm. After thinning one of the wafers down to p/2=9.6 nm, and after development using one of the described techniques, a nanostructure density of $2.7 \, 10^{15}/m^2$ is obtained having a size of less than 9.6 nm.

To obtain a period of 19.2 nm with the variant of the method illustrated in FIG. 1B, one of the wafers can be prepared with a vicinal surface having a 0.8° shift in direction <100> and bonded onto a non-vicinal silicon (100) wafer. The nanostructure densities obtained are then $2.7 \, 10^{15}/m^2$.

For the variant of the method illustrated in FIG. 1C, a silicon (100) wafer is bonded to a second wafer comprising on its surface a layer of SiGe. The mismatch f1 being 2.1%, an interface lattice of corner dislocation is formed having a period of 20 nm. After thinning the wafer containing the SiGe layer down to approximately 10 nm, and after development using one of the described techniques, a nanostructure density of the same order as previously is obtained. Bonding of a wafer in germanium would produce a twofold mismatch and therefore a nanostructure density that is four times greater.

Surfaces other than (100) surfaces may be used. For example (111) surfaces produce on their interface hexagonal or triangular dislocation lattices. (110) surfaces produce rectangular lattices. Two surfaces having different orientations, bonded to one another, also produce periodic or quasi-periodic lattices.

The variant of the method illustrated in FIG. 1A will be described below in further detail.

To simplify the description, a lattice of crystalline defects will be considered, on the understanding that it is generally associated with a lattice of strains and that selective treatments may also be conducted on the lattice strains.

FIG. 1A shows the contacting step of two wafers 1 and 2 in silicon having a (1,0,0) crystallographic plane and having opposite plane surfaces, 3 and 4 respectively. Plane surfaces 3 and 4 have undergone surface treatment to make them hydrophobic. This will ensure intimate, adherent contacting of surfaces 3 and 4. Said surface treatment comprises a chemical cleaning step ending for example with a hydrofluoric acid polishing step. For further details reference may be made to the chapter "Silicon Surface Chemical Composition and Morphology" by Gregg S. HIGASHI and Yves J. CHABAL, pages 433 et al. in "Handbook of Semiconductor Wafer Cleaning Technology" published under the direction of Werner KERN by Noyes Publications, Park Ridge, N.J., USA.

Contacting of surfaces 3 and 4 is made by molecular adhesion bonding, for example at room temperature ensuring that the crystalline lattices presented by the two surfaces are shifted in relation to one another by a determined angle β, for example 0.6°.

The unit formed by these two joined wafers is then subjected to heat treatment at a temperature in the region of 950° C. for approximately 30 minutes. During this heat treatment, stronger more numerous interatom bonds are formed between the two wafers. Given the twist angle existing between the two crystalline lattices, a lattice of crystalline defects, for example a lattice of dislocations is set up in the vicinity of the interface between the two wafers, in a layer of narrow thickness (a few tenths to a few hundredths of a nm) centred on the interface. This is shown in the diagram in FIG. 2 in which reference 5 denotes this interface, the crystalline defects (or dislocations) being shown under reference 6.

Experience has shown that these dislocations form a regular two-dimensional lattice (square in the example shown) having a step of approximately 40 nm. These facts are accounted for theoretically in the article "TEM observations on Grain Boundaries in Sintered Silicon" by H. FOLL and D. AST, published in Philosophical Magazine A, 1979, vol. 40, N°5, pages 589–610. Page 596 of this article reproduces a photograph of this type of lattice of dislocations.

The spacing between two adjacent dislocations is dependent upon rotation angle β of the crystalline lattices of both wafers. The value of this interval varies in reverse to sin (β/2). For β=5°, a spacing of 4.4 nm between adjacent dislocations is obtained.

Figure 2:
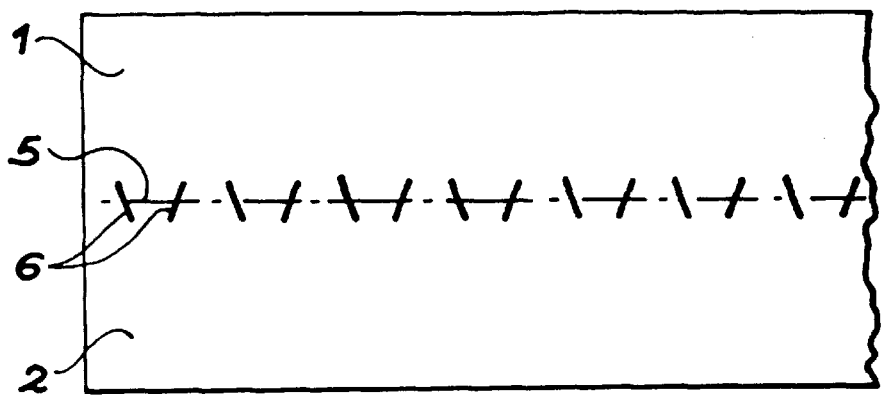
FIG. 2 is a side view of a unit formed of the two wafers in figure IA after they have been placed in contact.
Figure 3:
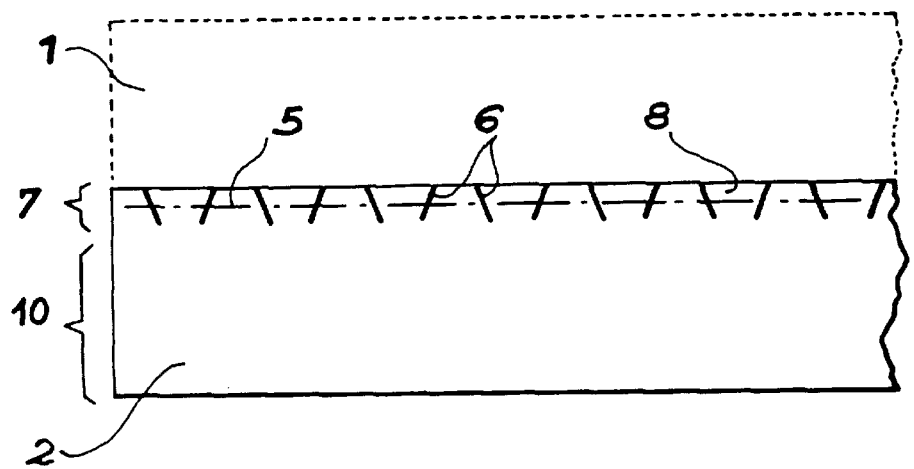
FIG. 3 is a side view of the unit shown in FIG. 2, after the thinning step of the method of the present invention.

To obtain a microstructure from the unit shown in FIG. 2, all that is required is to abrade (by grinding, mechanical polishing or chemical polishing) one of the two wafers stopping the abrasion operation when the zone of dislocations is reached. This is shown in FIG. 3 in which the microstructure is denoted by reference 7. It rests on a substrate 10 formed of the largest part of wafer 2.

Surface treatment may then be conducted to differentiate, in more specific manner, the crystalline defects of surrounding crystalline zone 8.

It is possible, for example, by means of a chemical bath to selectively remove the crystalline defects 6 without removing the adjacent crystalline zone 8. In the embodiment shown here, SECCO® or WRIGHT® chemical baths can be used. In this case a lattice of silicon microvolumes is obtained of square shape, with a lattice step size of 40 nm, insulated from one another by spaces.

Figure 4:
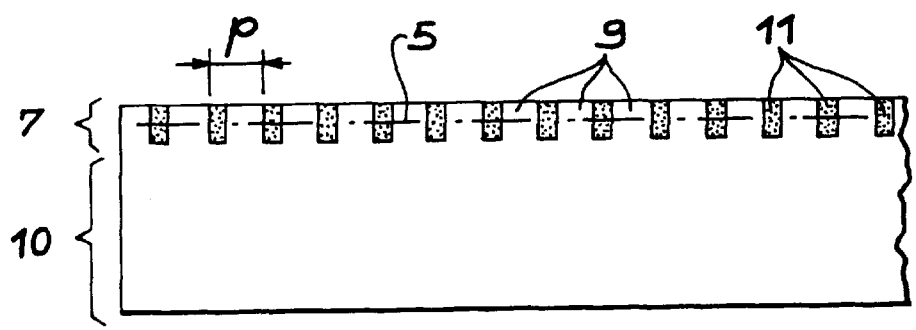
FIG. 4 is a side view of a microstructure obtained using the present invention.

Lateral dielectric insulation of microvolumes 9 may be made. For this purpose it is possible, for example, to heat oxidize microstructure 7 or to conduct CVD depositing. For some applications, the oxide layer deposited on microstructure 7 may be levelled down, as shown in FIG. 4, to maintain only an insulating deposit 11 between microvolumes 9. In this case, a lattice of insulating material is obtained substituting for the lattice of dislocations.

Surface treatment may also be conducted to render the lattice of dislocations conductive, insulating, even semiconductive in relation to the intended application. In this way the microvolumes or crystalline pads can be made either electrically connected to one another by conductor bonds, or electrically insulated, or connected by semiconductor zones or having a potential barrier. In respect of electric insulation, this also includes insulation such that electric conduction through insulating parts may take place by tunnelling effect for example, or by Fowler-Nordheim effect or by any other physical effect. To make the lattice of dislocations conductive, phosphorus diffusion may be conducted which preferably diffuses at the dislocations.

A further possible way of conducting the thinning step consists of applying the method described in document FR A 2 681 472 such as to obtain cleavage of the wafer concerned. For this purpose, protons for example are implanted in this wafer to obtain a layer of microcavities at the required depth of the surface to be placed in contact. This surface undergoes cleaning and bonding treatment. Heat treatment is then applied. It enables generation of the creation of dislocations and simultaneous cleavage according to the microcavity layer.

One of the wafers, the one intended to form the substrate, may be an SOI wafer (Silicon-On-Insulator) called SOI, and the other wafer may be a solid silicon substrate. The method of the invention then provides a lattice of silicon microvolumes on an insulator layer.

The two wafers in crystalline material may be of different type, for example a silicon wafer and a gallium arsenide wafer, or a silicon wafer and a germanium wafer. In addition, the wafers need not necessarily be homogeneous. The surfaces to be placed in contact simply need to be in crystalline material, the remainder of the wafers possibly offering other structures.

As mentioned above, the micro or nanostructure may also be obtained from a lattice of strains. This lattice of strains may be developed using various techniques.

The lattice of strains may be developed by depositing, using an epitaxy process (MOCVD, MBE) liquid phase epitaxy . . . ) on the thinned wafer of crystalline material having a crystalline mesh mismatch. With the island growth mode, the preferential nucleation sites provided by the zones subjected to compression (respectively to tension) promote the depositing of smaller (respectively greater) meshes than the thinned wafer. In this way an arranged set of islands is formed whose size corresponds to the underlying latticework.

Figure 5:
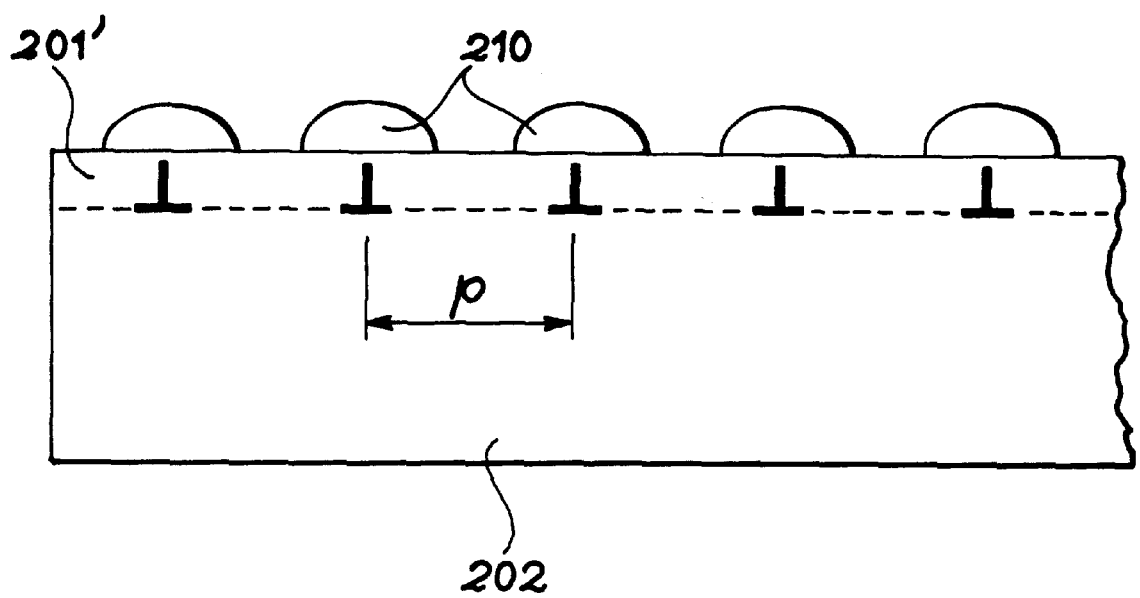
FIG. 5 is a side view of another microstructure obtained using the present invention.

This depositing may be illustrated using the variant of the method illustrated in FIG. 1C. A unit was prepared in accordance with this variant, as described above, using a silicon wafer with (100) orientation and a wafer comprising the SiGe layer. After thinning, the unit shown in FIG. 5 is obtained in which reference 202 denotes the silicon wafer and reference 201' denotes what remains of the SiGe layer; a deposit of pure germanium is made under Stranski-Krastanov growth conditions. Nanometric islands of germanium 210 are nucleated directly below the nodes of the dislocation lattice in the strain zones under tension.

What is claimed is:

1. A method for producing a micro or nanostructure on a substrate, comprising the steps of:

bonding by placing one surface of a first wafer in crystalline material in contact with one surface of a second wafer in crystalline material, such that the crystalline lattices presented by said surfaces offer at least one mismatch parameter able to allow the formation of a lattice of crystalline defects and/or a lattice of strains within a crystalline zone extending either side of the interface of the two wafers, at least one of said lattices determining the micro or nanostructure, thinning one of the two wafers to expose the lattice defects and/or lattice strains on a substrate formed by the other wafer, selective treatment of the lattice crystalline defects and/or lattice strains in relation to said crystalline zone, or vice versa.

2. Method according to claim 1, in which said mismatch parameter is formed by a determined angle of rotational shift in the crystalline lattices presented by said surfaces.

3. Method according to claim 1, in which said mismatch parameter is formed by a difference in crystalline mesh parameter between the crystalline materials of the contacted surfaces of the wafers.

4. Method according to claim 1, in which said mismatch parameter is formed by a determined angle according to which the surface of at least one of the wafers is shifted in relation to the ordinary crystallographic plane direction corresponding to this surface.

5. Method according to claim 1, in which the contacting is of hydrophobic type.

6. Method according to claim 1, in which the contacting is of hydrophilic type.

7. Method according to claim 1, in which, during the contacting step, the first wafer and second wafer are submitted to at least one of the following operations: heat treatment, pressurizing, application of an electric field.

8. Method according to claim 1, also comprising at least one heat treatment step intended to complete or end the formation of the lattice of crystalline defects and/or lattice strains.

9. Method according to claim 1, in which the thinning step is conducted by means of a technique chosen from among grinding, mechanical polishing or chemical polishing.

10. Method according to claim 1, in which the thinning step is conducted by cleavage of one of the wafers which, before the contacting step, is subjected via its contacting surface to an ion implantation step intended, at a determined depth corresponding to the required thinning, to create a layer of microcavities able to generate a cleavage plane during a subsequent heat treatment step.

11. Method according to claim 10, in which ion implantation is made by means of hydrogen ions.

12. Method according to claim 10, in which at least one heat treatment step is planned making it possible simultaneously to complete or end the formation of a lattice of crystalline defects and/or lattice of strains and to generate the cleavage plane.

13. Method according to claim 1, in which the selective treatment step comprises making conductive the crystalline defects and/or lattice strains such that said crystalline zone forms crystalline pads electrically connected to one another.

14. Method according to claim 13, in which the crystalline defects are made conductive by phosphorus diffusion.

15. Method according to claim 1, in which the selective treatment step comprises electric insulation so that said crystalline zone forms crystalline pads electrically insulated from one another.

16. Method according to claim 15, in which the selective treatment comprises chemically polishing the crystalline defects and/or lattice strains.

17. Method according to claim 16, in which said chemical polishing is preceded by a decoration phase of the crystalline defects and/or lattice strains by precipitation of metallic or doping impurities.

18. Method according to claim 16, in which chemical polishing is followed by the depositing of an electric insulator.

19. Method according to claim 15, in which said electric insulation is of the type in which electric conduction may take place therein by means of a physical effect such as the tunneling effect or the Fowler-Nordheim effect.

20. Method according to claim 1, in which the selective treatment step comprises treating the crystalline defects and/or lattice strains such that said crystalline zone forms crystalline pads connected together by semiconductor zones or having a potential barrier.

21. Method according to claim 1, in which the selective treatment step comprises depositing, by epitaxy, a crystalline material having crystalline mesh mismatch with the crystalline material exposed by the thinning step, this deposited crystalline material forming an arranged set of islands corresponding to the lattice of crystalline defects and/or underlying lattice strains.

22. Micro or nanostructure on a substrate, obtained according to claim 1, from wafers whose contacting surfaces are in semiconductor material, the crystalline lattices presented by said surfaces offering at least one mismatch parameter allowing the formation of a lattice of crystalline defects and/or lattice of strains from which arises said micro- or nanostructure.

23. Micro or nanostructure on a substrate according to claim 22, in which at least one of said contacting surfaces is in SiC.

24. Micro or nanostructure on a substrate according to claim 22, in which at least one of said contacting surfaces is in III–V semiconductor material such as AsGa or GaAlAs.

25. Micro or nanostructure on a substrate, obtained according to claim 1, one of the wafers being formed by a Silicon-On-Insulator wafer, the other wafer being in silicon and forming the thinned wafer, the method enabling a micro or nanostructure to be obtained made up of silicon microvolumes on an insulator layer.

* * * * *